(12) United States Patent
Fonash et al.

(10) Patent No.: US 6,277,714 B1
(45) Date of Patent: Aug. 21, 2001

(54) METAL-CONTACT INDUCED CRYSTALLIZATION IN SEMICONDUCTOR DEVICES

(75) Inventors: Stephan J. Fonash; Sanghoon Bae, both of State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/400,496

(22) Filed: Sep. 21, 1999

Related U.S. Application Data

(60) Provisional application No. 60/101,259, filed on Sep. 21, 1998, and provisional application No. 60/106,897, filed on Nov. 3, 1998.

(51) Int. Cl.[7] ................................................. H01L 21/20
(52) U.S. Cl. ........................................................... 438/486
(58) Field of Search .................................... 438/479, 486; 257/64, 66; 117/8, 930

(56) References Cited

U.S. PATENT DOCUMENTS

| 5,147,826 | * | 9/1992 | Liu et al. | 438/479 |
|---|---|---|---|---|
| 5,254,484 | | 10/1993 | Hefner et al. . | |
| 5,264,072 | * | 11/1993 | Mukai | 117/43 |
| 5,275,851 | | 1/1994 | Fonash et al. . | |
| 5,843,811 | * | 12/1998 | Singh et al. | 438/166 |

* cited by examiner

Primary Examiner—Keith Christianson
(74) Attorney, Agent, or Firm—Ohlandt, Greeley, Ruggiero & Perle, L.L.P.

(57) ABSTRACT

The method of the invention induces crystallization in an amorphous semiconductor layer, and includes the steps of: a) producing a patterned metal layer on a first substrate, the metal layer exhibiting a weak level of adherence to the first substrate; b) pressing the metal layer into physical contact with the amorphous semiconductor layer; c) applying heat, light or both to the metal layer and amorphous semiconductor layer to cause a reaction therebetween and a crystallization of the amorphous semiconductor that is juxtaposed to the metal.

11 Claims, 6 Drawing Sheets

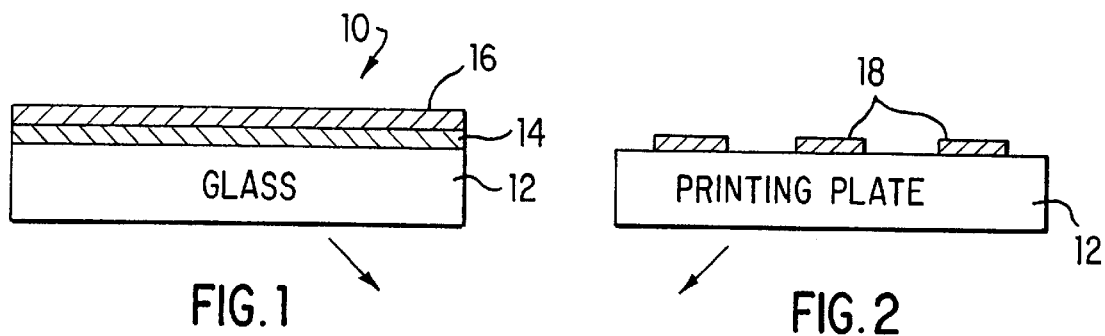
FIG. 1
FIG. 2
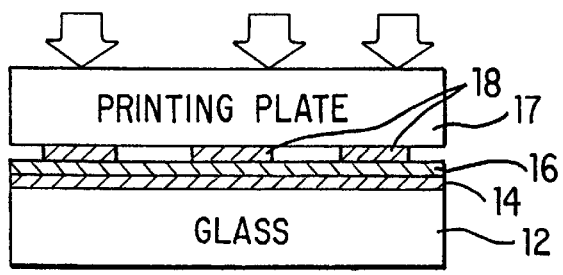
FIG. 3
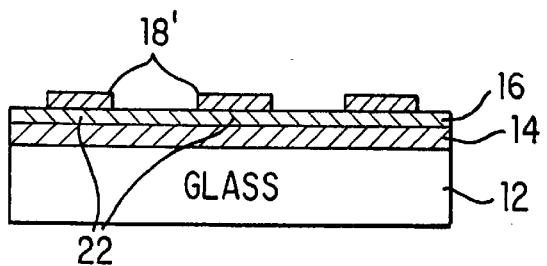
FIG. 4

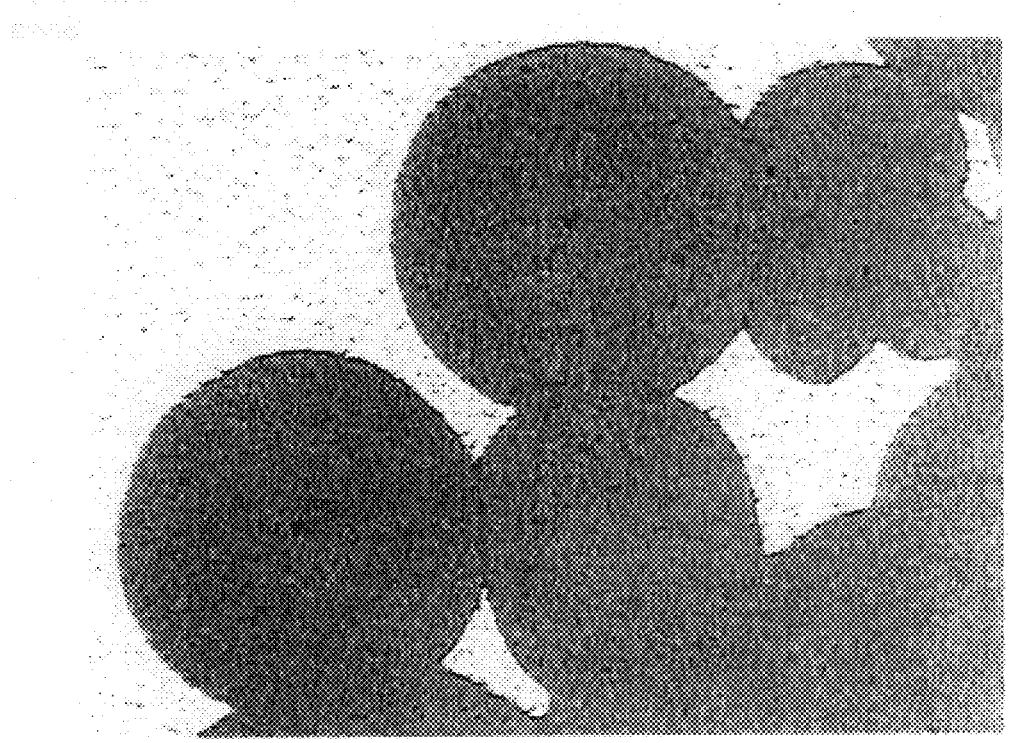
FIG.12　100μm
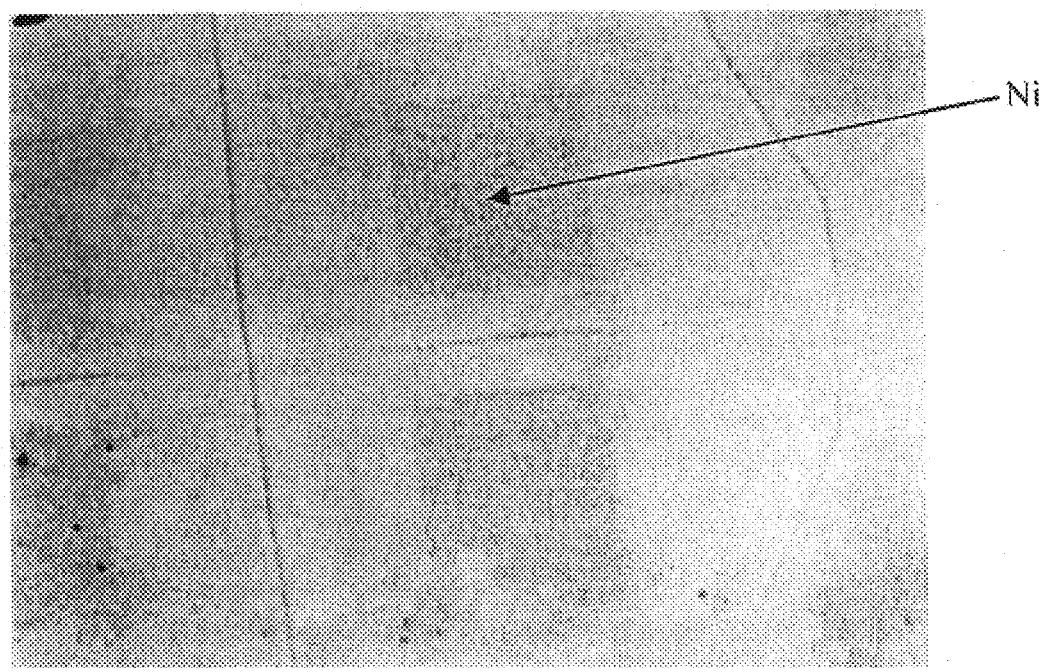
FIG.13　100μm

METAL-CONTACT INDUCED CRYSTALLIZATION IN SEMICONDUCTOR DEVICES

This Application claims priority from U.S. Provisional Applications: Serial No. 60/101,259, filed Sep. 21, 1998 and Serial No. 60/106,897, filed Nov. 3, 1998.

FIELD OF THE INVENTION

This invention relates to a method for inducing selective crystallization of an amorphous semiconductor and more particularly, to a method which uses a "metal" printing action to provide crystallization seed sites from which crystallization in a semiconductor layer commences and from which large grains can be produced.

BACKGROUND OF THE INVENTION

Displays, photovoltaics, microelectronics, and MEMS (microelectro-mechanical devices) employ polycrystalline silicon (poly-Si) films. There is a need to be able to fabricate such poly-Si films at low temperatures, using low-cost processing techniques. Poly-Si is used in thin film transistors (TFTs) for the active channel region because of its relatively high mobility and in solar cells for the same reason; i.e., its high carrier mobility.

Low resistance metal/poly-Si silicide materials are also needed for the source and drain contact or contact finger regions of TFTs and for the contact regions of solar cells. Such silicides offer low resistance, chemical stability, and relatively low temperatures of formation. Low resistance metal silicides, formed with poly-Si also are useful as resistors and interconnects in displays, microelectronics, and MEMS, if the metal/poly-Si silicide regions can be readily isolated. Such metal silicide regions can also be subsequently used to initiate electrochemical or electroless deposition of additional metallic layers. In such case, the metal/poly-Si silicide can serve as a foundation for subsequent depositions for further tailoring of resistance.

Metal silicides are currently fabricated by reacting co-deposited or sequentially deposited silicon and metal or by a deposited metal film with a silicon substrate or film. This is often done by vacuum depositing the metal, patterning it lithographically, and then reacting the metal with the silicon substrate, using an elevated temperature process.

Thin film poly-Si films can be directly deposited or deposited in amorphous silicon (a-Si) form and then crystallized into poly-Si films. In the latter approach, crystallization of the a-Si into poly-Si can be achieved by various methods: laser crystallization, solid phase crystallization, and metal induced solid phase crystallization. The metal induced crystallization (MIC) SPC process has been also used to make poly-Si devices in a pre-determined pattern to cause selective crystallization with a low thermal budget. For poly-Si films produced by MICSPC, the metals (e.g., Pd, Ni, Cr or Mo) have been physically deposited in vacuum or from solution. See, for example, U.S. Pat. Nos. 5,147,826 and 5,275,851.

Regardless of the method used to fabricate poly-Si films, the resulting grain size of the poly-Si film plays a crucial role in determining the performance of a device. Grain size affects critical device parameters such as carrier mobilities in transistors, thin film transistors (TFTs), solar cells, detectors; on/off ratio of transistors and TFTs; switching speed of transistors and TFTs; and efficiencies of solar cells. However, none of the methods used to produce thin film poly-Si (including the as-deposited approach), has been able to produce grain sizes larger than on the order of tens of microns (e.g., 10~50 μm), i.e., see Lee et al., Appl. Phys. Lett. 66, 1671 (1995).

There is a need for a low cost, low temperature method for inducing crystallization in amorphous semiconductors. Also there is a need to produce large crystals during such a crystallization procedure.

SUMMARY OF THE INVENTION

The invention is a low-cost, pressure-printing method that transfers a metal pattern to an amorphous semiconductor layer. Application of the metal pattern, using heat and applied pressure, results in a patterned poly-crystalline semiconductor region, or in the event that the semiconductor is silicon and the metal is a silicide-former, the application results in a patterned metal/poly-crystalline silicide region. The method further uses the printed metal region (i) to catalyze the MIC process adjacent to the metallized region to produce poly-Si therein and to simultaneously form silicide contacts at the printed region, or ii) to form preselected metal silicide regions isolated by non-crystallized and non-silicided a-Si (for resistor and interconnect applications). In the latter case, the non-silicided regions of silicon can be subsequently oxidized after or during silicidation, thereby forming an ideal isolating medium; i.e., $SiO_2$. In either case, the printed metal layer plays the key role of inducing crystallization at a low anneal temperature.

The method of the invention induces crystallization in an amorphous semiconductor layer, and includes the steps of: a) producing a patterned metal layer on a first substrate, the metal layer exhibiting a weak level of adherence to the first substrate; b) pressing the metal layer into physical contact with the amorphous semiconductor layer; c) applying heat to the metal layer and amorphous semiconductor layer to cause a reaction therebetween and a crystallization of the amorphous semiconductor that is juxtaposed to the metal. The reaction also causes a greater level of adherence to occur between the metal layer and the amorphous semiconductor than the weak level of adherence between the metal layer and the first substrate, allowing the metallization to adhere to the semiconductor when the first substrate is removed.

BRIEF DESCRIPTION OF THE DRAWINGS

FIGS. 1–4 illustrate the steps of the method of the first embodiment of the invention.

FIG. 12 is a photomicrograph of a selectively crystallized a-Si film that exhibits large Si grains, induced by Ni seeds emplaced by a printing action, after a 3 hour anneal at temperatures not exceeding 650° C., while pressure is applied to the printing plate.

FIG. 13 is a photomicrograph of a selectively crystallized a-Si film by Ni patterning created by a printing action, after a 3 hour anneal at temperatures not exceeding 650° C. while pressure is applied to the printing plate.

DETAILED DESCRIPTION OF THE PREFERRED EMBODIMENTS

Figure 5:
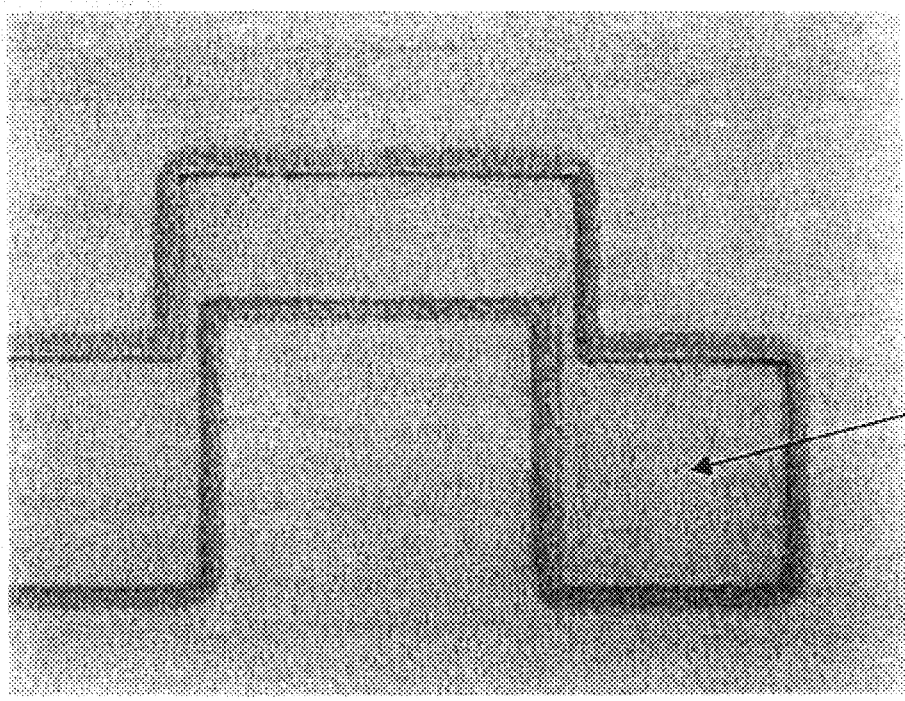
FIG. 5 is a photomicrograph of a selectively crystallized a-Si film, by Ni patterning, created by a printing action, after a 1 hour anneal at 550° C. while pressure is applied to the printing plate.

FIGS. 1–4 show the printing process which comprises the first embodiment of the invention. Instead of using a crystallization-inducing metal catalyst layer produced by sputtering, spraying, evaporating, or dipping into a metal bearing solution to deposit MIC metals (as in the prior art), patterned metal layers are "printed" by pressing a "printing plate" to an amorphous semiconductor layer that needs to be crystallized, or needs to have a low resistance silicide region.

Heat is applied during this pressing to transfer metal atoms from metal regions of the printing plate to the a-Si layer. This heat can be applied by conventional furnace annealing or via a rapid thermal anneal (RTA) process. In addition to the heat produced by the furnace anneal or RTA, to assure the formation of metal suicides, a high current density (e.g., >$10^5$ A/cm$^2$) electrical current can be applied to cause Joule heating, electromigration of the metal, or both, during the pressing to further the metal transfer and formation of metal silicides.

With reference to FIG. 1, a substrate 10 is prepared by depositing on a glass layer 12, an optional barrier layer 14 of, for example, silicon nitride 14, followed by an amorphous layer of silicon 16. To prepare a patterned metal printing "plate" (see FIG. 2), lithographic processes and etching, commonly used in semiconductor processing, are employed to define MIC metal patterns 18 (e.g., Pd, Ni, Cr or Mo) on "plate" 17. It is preferred that the MIC metal pattern 18 be loosely adherent to plate 17 (e.g. a glass). Through the use of anti-reflection and reflection coatings, these printing "plates" can be designed for optimum use of RTA so that just the patterned regions are heated.

As shown in FIG. 3, plate 17 is pressed against substrate 10 so that MIC metal 18 is pressed against a-Si film 16. At the same time, the structure of FIG. 3 is subjected to an anneal treatment (i.e., thermal or light exposure). As a result, a metal silicide interface is created between metal 18 and a-Si layer 16. The MIC metal pattern is then transferred (all or in part) onto substrate 10 (see FIG. 4). Further a-Si film 16 is crystallized in regions 22 at and adjacent to transferred metal regions 18'. The creation of the silicide regions results in a greater level of adherence of the transferred metal regions 18' to substrate 10 than that existing between metal regions 18 and plate 17. Accordingly, when plate 17 is removed from substrate 10, metal regions 18' remain attached to substrate 10.

As a result of the above procedure, poly-Si layers are created as are metal/poly-Si low resistance layers that can both be utilized during subsequent semiconductor processing.

Figure 6:
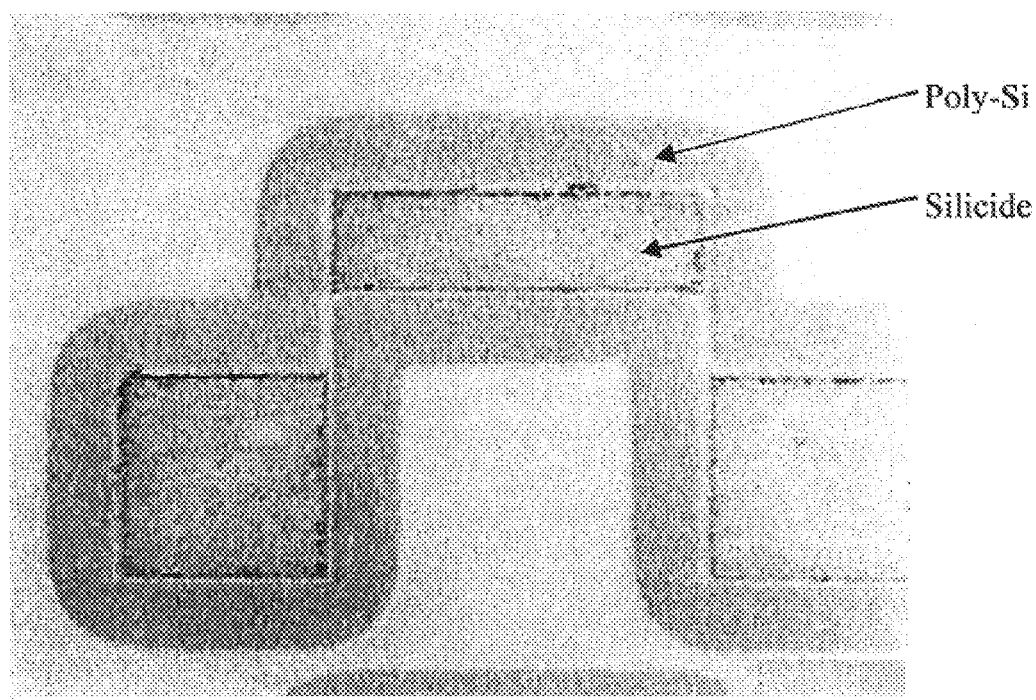
FIG. 6 is a photomicrograph of a selectively crystallized a-Si film, by Ni patterning, created by a printing action, after a 3 hour anneal at 550° C. while pressure is applied to the printing plate.

FIGS. 5 and 6 display photomicrographs of selectively crystallized a-Si films, produced by the "printing" process of FIGS. 1–4, wherein Ni was the MIC metal. A 1000 Å silicon nitride layer and a 1000 Å a-Si layer were consecutively PECVD deposited at 320° C. on Corning 7059 glass. A printing plate was prepared by evaporating a 500 Å Ni layer onto a Corning 1737 glass substrate. The Ni film was then patterned into a thin film isolation pattern.

In FIG. 5, a 1 hour anneal at 550° C. was performed during the pressing, and in the case of FIG. 6, a 3 hour anneal at 550° C. was performed during pressing. As seen in FIGS. 5 and 6, poly-Si films surround the Ni patterns that have induced the crystallization of the a-Si films. As also seen in FIGS. 5 and 6, there are clearly defined metal silicide patterns that are surrounded by crystallized poly-Si films; i.e., the areas surrounding the silicide patterns are poly-Si which can visually be distinguished due to the absorption difference between the crystallized poly-Si and the non-crystallized a-Si. As shown in FIGS. 5 and 6, the poly-Si area surrounding the metal pattern grows proportionally with annealing time; i.e., the widths of poly-Si areas in FIG. 5 and 6 are about 8 and 25 $\mu$m, respectively, giving a lateral crystallization rate of 8 $\mu$m/hr. It is to be noted that selective printing of the metal pattern can be used for device contact isolation since the crystallization is seen to occur selectively around the printed metal pattern.

Figure 7:
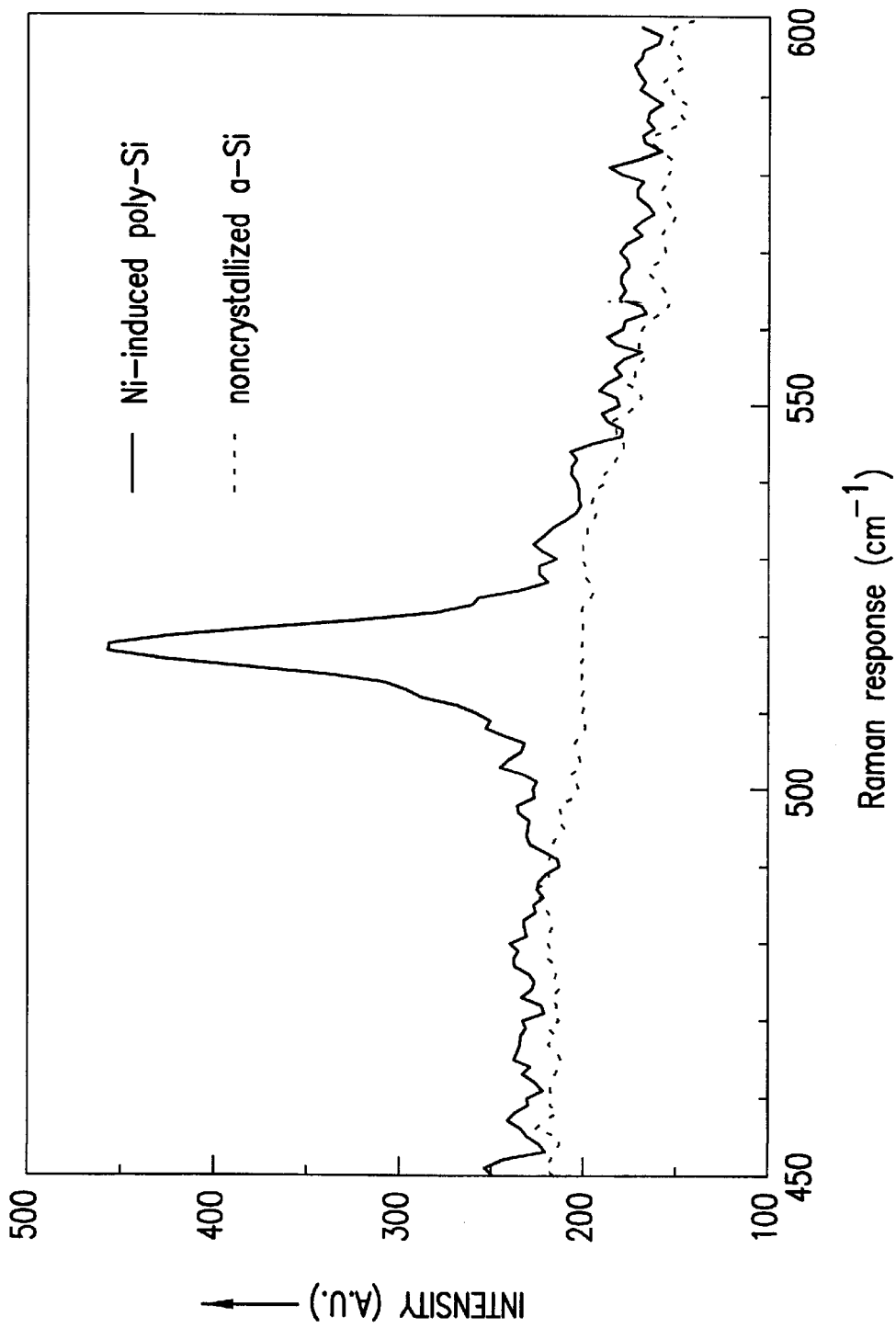
FIG. 7 is a plot of Raman Response Shift versus wave number for both Ni-induced poly-Si and non-crystallized poly-Si.

To assess further the poly-Si film produced by the printing process of the invention, a Raman spectrometer was employed with an Ar laser (wavelength=514 nm). The incident laser beam was focused to 3 $\mu$m diameter spot on the surface of the samples. Raman spectra for printed Ni induced poly-Si and non-crystallized a-Si areas are shown in FIG. 7 for the 3 hr. annealed sample. As seen in the crystallized area, the crystallized Si transverse optical (TO) phonon peak at 519 cm$^{-1}$, which is the hallmark of crystalline Si, is clearly present, whereas no optical phonon peak is present around 519 cm$^{-1}$ for the non-crystallized a-Si region.

The printed metal patterns of FIGS. 5 and 6 were examined using a surface profiler and conductivity measurements. According to the surface profile measurement, 400–450 Å of Ni was moved from the printing plate to the a-Si film substrate for the 3 hr transfer/crystallization sample. These printed Ni patterns adhered to the substrate during both 10 minute ultrasonic cleanings with alcohol and with deionizd water.

As anneal time is increased, the poly-Si area surrounding the metal silicide pattern is widened, as shown in FIG. 6. Since crystallization is selectively induced around the metal pattern, the printed metal pattern induced-crystallization can be used for a device isolation step in poly-Si device fabrication processes. Measurements indicated that the conductivity of the metal silicide region of the illustrated pattern was in the range of $10^5$~$10^5$ S/cm. This is conductive enough to be used for electrical metal contacts, interconnects, and tailored resistors.

The conductivity of the silicided areas can be adjusted down from this high conductivity range for resistor applications by control of the thermal budget (temperature vs. time) and the pressure during the printing step. In addition, the silicide regions can then be used to drive selective electrochemical deposition or electroless deposition onto the printed regions.

As can thus be seen, the metal (e.g., Ni, Pd, Cr, Cu or Mo) printing method described above can be used for producing poly-Si regions and for producing metal/poly-Si silicide, resistors, or interconnect regions. The technique replaces metal deposition, lithography, and etching steps with a simple printing step. The annealing during the pressing seen in FIGS. 1–4 can be furnace annealing or a rapid thermal anneal. The latter allows the use of lower temperatures in the regions not to be crystallized. This can be assured if the printing plate is designed to absorb the light of RTA only in the metallized regions. Further, depending upon the source used to accomplish the anneal action (i.e., heat or light or both), a 6 hour or less exposure time should be sufficient to accomplish the printing action.

It has been further discovered that the printing method of the invention can be modified to provide a low-cost, metal-induced solid phase large grain growth in thin film poly-Si semiconductor devices. The modified method is capable of achieving large grain sizes ($\geq 100$ $\mu$m).

In solid phase crystallization, the crystallization of the a-Si into poly-Si films consists of two stages; i.e., nucleation and grain growth. Since the nucleation stage has a higher activation energy than the grain growth stage, employing heterogeneous nuclei can lower crystallization temperatures. Some metals (e.g., Ni, Cr, Ti, Co, Fe, or In), or these metals silicides that have good lattice match with crystalline Si, can act as heterogeneous nuclei and enhance solid phase, large-grain growth.

Figures 8, 9:
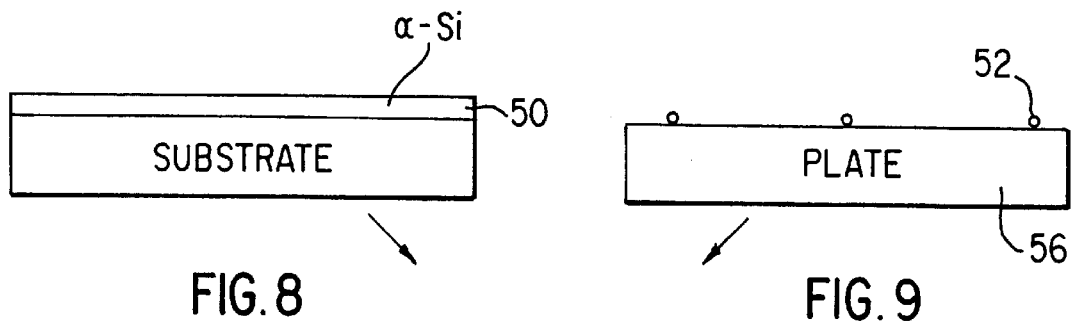
FIGS. 8–11 illustrate the steps of the method of the second embodiment of the invention.
Figure 10:
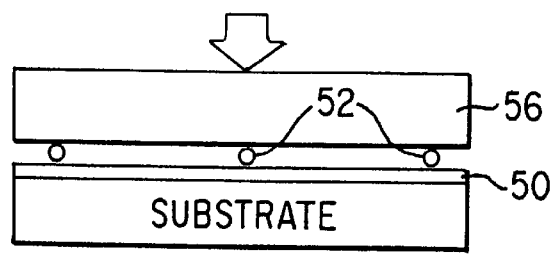
Figure 11:
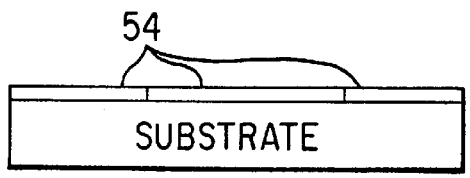

FIGS. 8–11 depict a method for obtaining metal-induced solid phase large grain growth from an a-Si precursor film 50 (FIG. 8), using patterned metal seeds 52 (FIG. 9). As shown in FIG. 10, metal patterns or seeds 52 are "printed" onto a-Si film 50 by pressing during the application of heat or light. By proper choice of the printed pattern, a-Si film 50 can be crystallized into large grains (FIG. 11) or one large grain.

To prepare the patterned printing plate of FIG. 9, lithographic processes and etching can be used to define metal patterns or seeds 52 on "plate" 56. In an extension of printing approach, patterned metal plate 56 can be used not only to induce crystallization but also to supply n or p type dopants for semiconductor devices; i.e., metal printing plate 56 and seeds 52 can act as a dopant supplier from which n or p type dopant diffuses into semiconductor or a-Si surfaces during annealing for crystallization. To incorporate n or p type dopants on the surface of metal patterns/seeds 52, ion implantation, sputtering, electroless plating, spraying, or other dopant incoporation approaches can be employed.

A Ni printing block and Ni seeds were chosen to demonstrate metal-induced, solid phase, large grain growth from amorphous silicon precursors. FIGS. 12 and 13 are photomicrographs that show large crystalline Si grains ($\geq 100$ $\mu$m) which have been induced by Ni seeds printed on the a-Si precursor film, using a patterned Ni block or printing plate. The samples were annealed for 3 hour at 550° C. and 1.5 hour at a temperature not exceeding 650° C. during the printing process; i.e., during the pressing of metal seed patterns 52 onto the a-Si films.

To observe grain structures, the crystallized films in FIGS. 12 and 13 were etched by a Secco etchant. In both cases, crystalline Si (i.e., large grain Si) is seen to be laterally growing until the grains impinge on another. Depending on how the metal pattern is designed or how the metal seeds are distributed, the sizes of these metal induced large grains can thus be controlled by controlling when impingement occurs.

Figure 14:
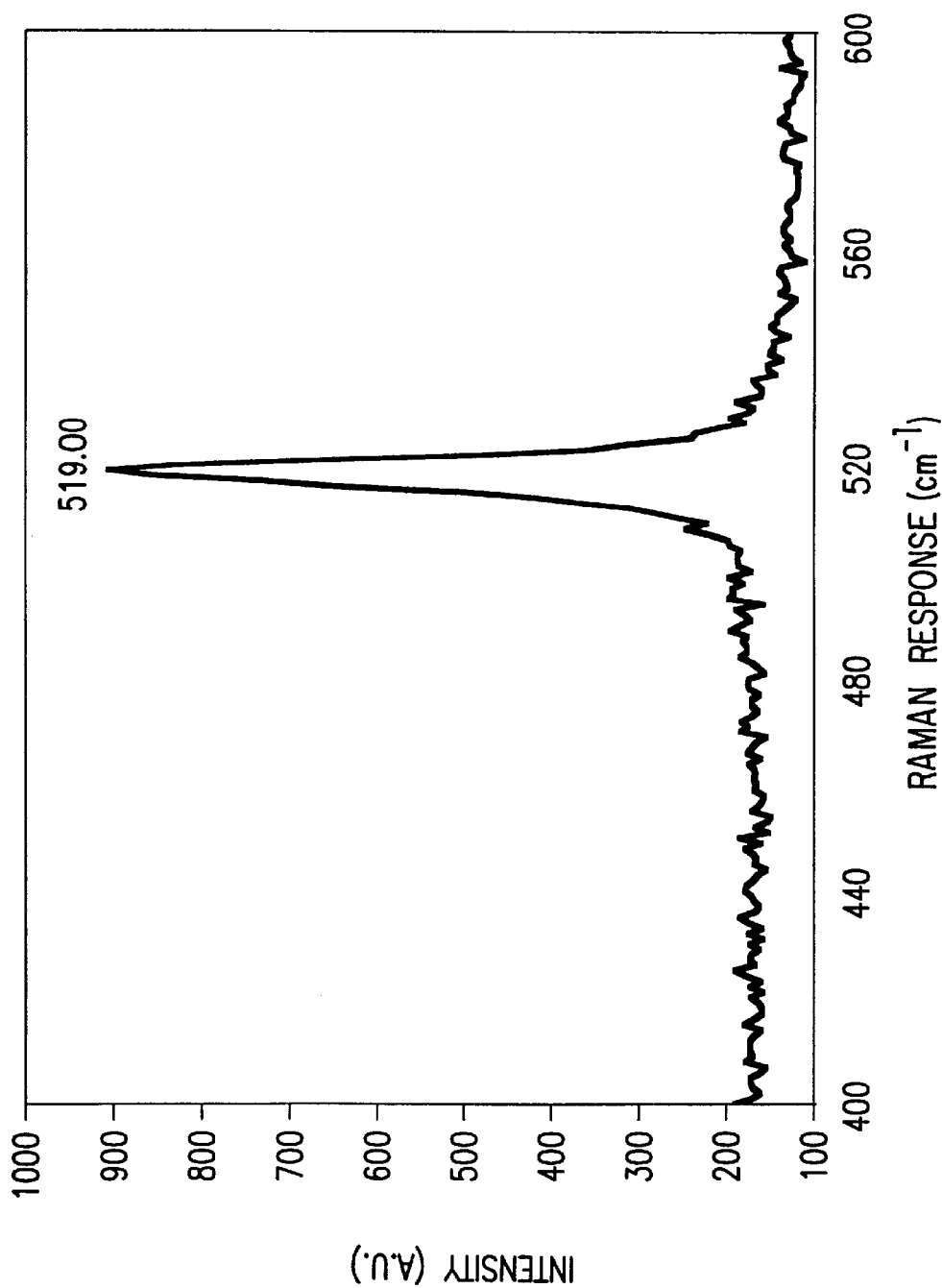
FIG. 14 is a plot of the Raman Response from the crystallized Si grain.

Raman spectroscopy was used to measure the crystallinity of thin films Si samples. In the Raman spectrum, the peaks at ~520 $cm^{-1}$ and ~480 $cm^{-1}$ originate from transverse optical (TO) modes of crystalline Si and a-Si, respectively. FIG. 14 shows Raman scattering from the sample shown in FIG. 13. The Raman pattern seen in FIG. 14 displays a strong peak at 519 $cm^{-1}$ which corresponds to the TO mode of crystalline Si while it does not show any broad shoulder at ~480 $cm^{-1}$ which is present when there is amorphous content in the film.

It has been determined that a fluctuating temperature anneal procedure can speed the creation of the large grain growth. To be specific, if the temperature is cycled a number of times between about 350° C. to about 750° C. and maintained at the higher temperature for a short enough period that the elevated temperature does not significantly affect the support for the semiconductor layer, more rapid creation of the larger grains is seen. The maximum anneal temperature in such a fluctuating temperature exposure is dependent upon the softening temperature of the substrate.

The approach of using the printing of metal seed patterns to induce large grain growth can be used for producing large grain poly-Si films for TFTs, solar cells, or microelectronic devices. Having such large grains of controlled size and location means CMOS circuitry for microelectronics can be fabricated inside a grain; TFTs can located intra-granularly; and large area devices such as solar cells and detectors can be made with very large grains. By employing this solid phase large grain growth method, high quality thin film devices can be made and the number of processing steps can be reduced.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for inducing crystallization in an amorphous semiconductor layer, said method comprising the steps of:

producing a patterned metal layer on a first substrate;

pressing said patterned metal layer into physical contact with said amorphous semiconductor layer;

applying heat, light or both to said metal layer and amorphous semiconductor layer to cause a crystallization of regions of said amorphous semiconductor that are in juxtaposition to said metal region.

2. The method as recited in claim 1, wherein said metal layer exhibits a weak level of adherence to said first substrate and said applying of heat, light or both causes a reaction between said metal layer and amorphous layer, said reaction causing a greater level of adherence than said weak level of adherence between said metal layer and amorphous semiconductor, so as to allow said metal layer to adhere to said semiconductor layer when said first substrate is removed therefrom.

3. The method as recited in claim 1, wherein said metal layer is selected from the group consisting of: Pd, Ni, Cr, Cu or Mo.

4. The method as recited in claim 1, wherein said semiconductor is silicon.

5. The method as recited in claim 4, wherein said metal is a silicide forming metal.

6. The method as recited in claim 1, wherein said applying step causes said patterned metal layer and amorphous semiconductor to be subjected to temperature range of about 350° C. to 750° C. for a period of about six hours or less.

7. The method as recited in claim 6, wherein said applying step causes the temperature to be repeatedly cycled between lower and upper limits of said temperature range.

8. The method as recited in claim 1, wherein said patterned metal layer comprises a plurality of metal particles.

9. The method as recited in claim 1 wherein said patterned metal layer further includes a dopant material that is caused to penetrate said semiconductor during said applying step.

10. The method as recited in claim 1, wherein said applying step further causes application of a current between said patterned metal layer and said amorphous semiconductor layer to aid in formation of a metal silicide therebetween.

11. The method as recited in claim 1, wherein said applying step causes said patterned metal layer and said amorphous semiconductor layer to be heated only where said patterned metal layer and said amorphous semiconductor layer are in juxtaposition.

* * * * *